United States Patent [19]

Hopkins

[11] Patent Number: 5,051,629
[45] Date of Patent: Sep. 24, 1991

[54] SIGNAL DELAY AND REPRODUCTION DEVICE AND METHOD

[76] Inventor: Michael C. Hopkins, Rte. #1, Box 225M, Stokesdale, N.C. 27357

[21] Appl. No.: 561,185

[22] Filed: Aug. 1, 1990

Related U.S. Application Data

[63] Continuation of Ser. No. 208,658, Jun. 20, 1988, abandoned.

[51] Int. Cl.⁵ ............................................. H03K 5/159
[52] U.S. Cl. ................................... 307/603; 307/605; 307/590; 307/597; 328/55
[58] Field of Search ............... 307/590, 597, 603, 605, 307/253, 571, 443; 328/55, 66

[56] References Cited
PUBLICATIONS

Weber, "Delay Circuit Affects Leading Edge Only", EDN Oct. 29, 1987, pp. 252, 254.

Primary Examiner—Stanley D. Miller
Assistant Examiner—Phan Trong

[57] ABSTRACT

Devices and methods are presented for providing an AC signal delay. By control charging the interelectrode capacitance of the devices the length of the rise and fall times of a switching device can be increased and the signal accordingly delayed. Electrical circuitry is provided having a variable AC signal control means and a capacitor-switch joined to the signal control means. Changing the bias of the capacitor-switch will terminate the time delay. A signal entering the circuit input is therefore adjustably delayed and exactly reproduced prior to exiting the circuitry.

20 Claims, 4 Drawing Sheets

SIGNAL DELAY AND REPRODUCTION DEVICE AND METHOD

This is a continuation of application Ser. No. 07/208,658 filed 20 June 1988, now abandoned.

BACKGROUND OF THE INVENTION

1. Field Of The Invention

The invention as presented herein relates to electrical circuit delay devices and specifically concerns signal delay apparatus and methods utilizing interelectrode capacitance.

2. Description Of The Prior Art And Objectives Of The Invention

Various delay circuits and devices have been used in industry for many years including circuits as set forth in U.S. Pat. No. 4,330,750 which employ a chain of logic gates. Delay devices such as seen in U.S. Pat. Nos. 3,588,547; 3,786,283; and 3,824,411 show other types of circuit delays. While the prior art delay devices and methods may be useful under certain instances, each has its shortcomings such as for example U.S. Pat. Nos. 4,330,750, 3,588,547, and 3,824,411 depict large component count delay circuits not well suited for high density packaging situations. The circuitry in U.S. Pat. No. 4,330,750 utilizes a complex trim technique involving trim capacitors, a variable voltage source, and a digital multiplexer, although subnanosecond delays are achieved. U.S. Pat. No. 3,588,547, it has a somewhat limited bandwidth, as well as a high component count.

With the known disadvantages of prior art delay devices and methods, the present invention was conceived and one of its objectives is to provide an adjustable AC signal delay device with an easily adjustable AC signal control means for use in electrical circuits.

Another objective of present invention is to provide a signal delay device which controls the charging of the interelectrode capacitance of the device.

Yet another objective of present invention is to provide a signal delay device which uses a capacitor-switch joined to the signal control means.

Still another objective of present invention is to provide a method for delaying an AC signal which includes directing the signal to an internal capacitor-switch, and whereby changing the bias of the capacitor-switch terminates the time delay.

Other objectives and advantages of present invention will become apparent to those skilled in the art as more detailed presentation of the invention is presented below.

SUMMARY OF THE INVENTION

An AC signal delay device is presented with a method of operation whereby input pulse signals are adjustably delayed as needed for various electronic devices. A capacitor-switch is connected to an external capacitor and to a signal control means. A signal entering the circuit input which is joined to a signal control means is adjustably delayed prior to exiting circuitry which communicates with the capacitor-switch. In another embodiment of the apparatus of the invention the capacitor-switch includes a logic gate.

In the method of the invention an AC signal is directed to a signal control means. The controlled signal then charges the internal capacitor-switch which is normally active or inactive. When the charging internal capacitor-switch charges to the bias activation or deactivation voltage of the buffer, it switches it into an active or inactive mode of operation whereby the delay is terminated, and the AC signal is then output.

Figure 3:
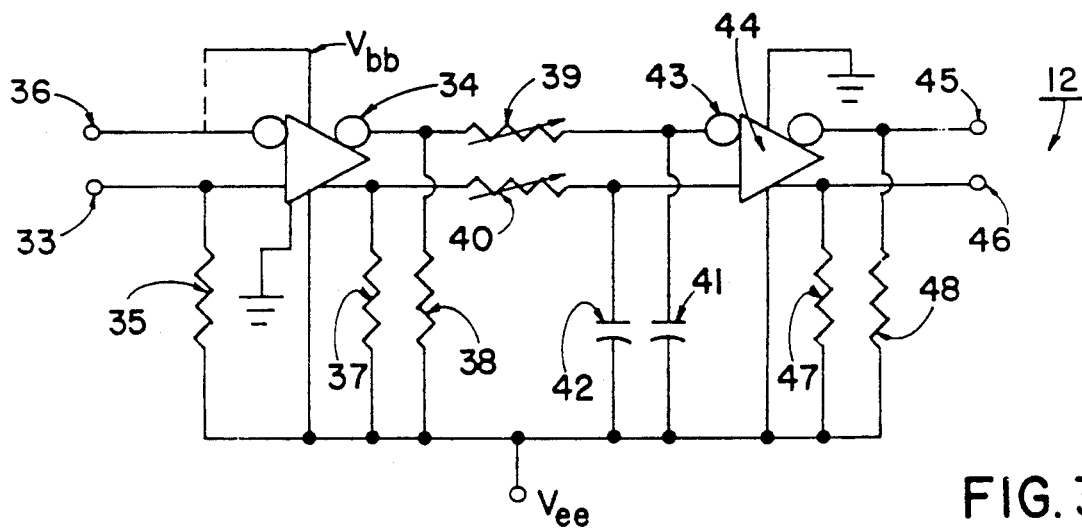

The embodiment as shown in FIG. 3 demonstrates a use of a differential line receiver whereby an ECL signal can be delayed and accurately reproduced.

Figure 4:
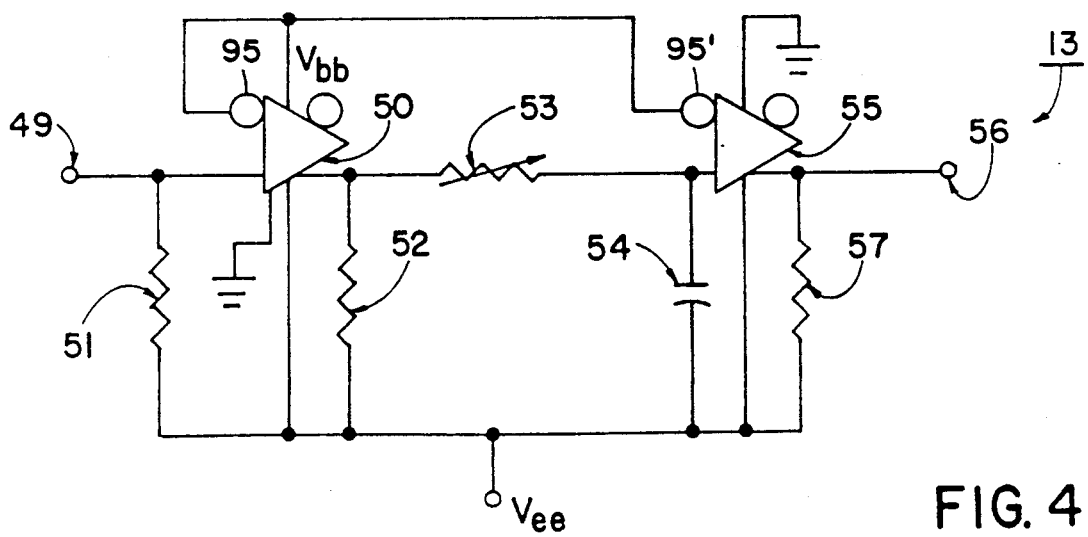

FIG. 4 shows an embodiment of the invention utilizing a differential logic gate to delay and reproduce an ECL signal.

Figure 5:
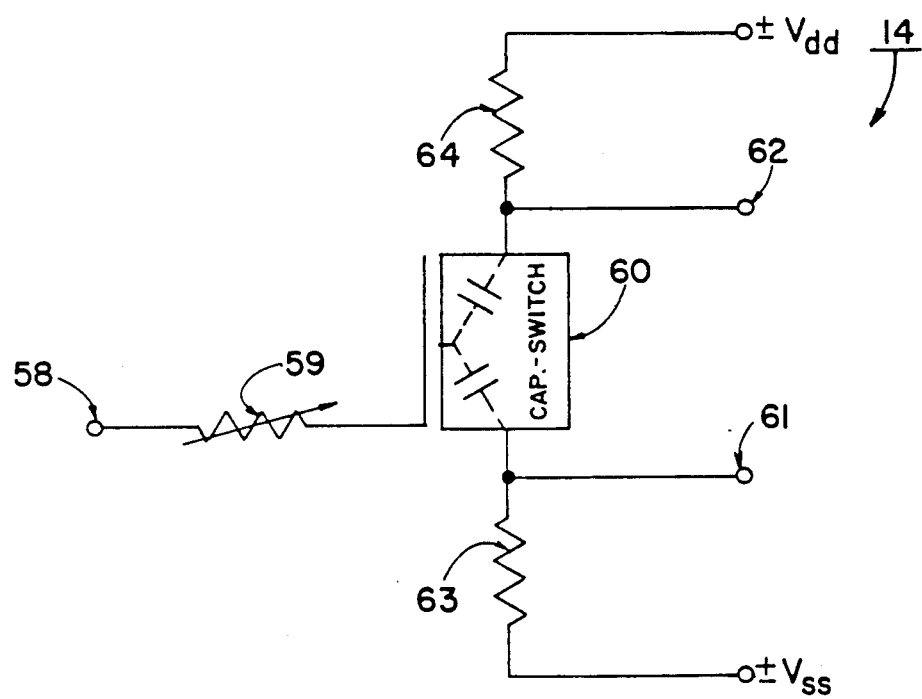

FIG. 5 illustrates another embodiment of the invention in which the input pulses will activate a normally inactive enhancement mode MOSFET transistor.

Figure 6:
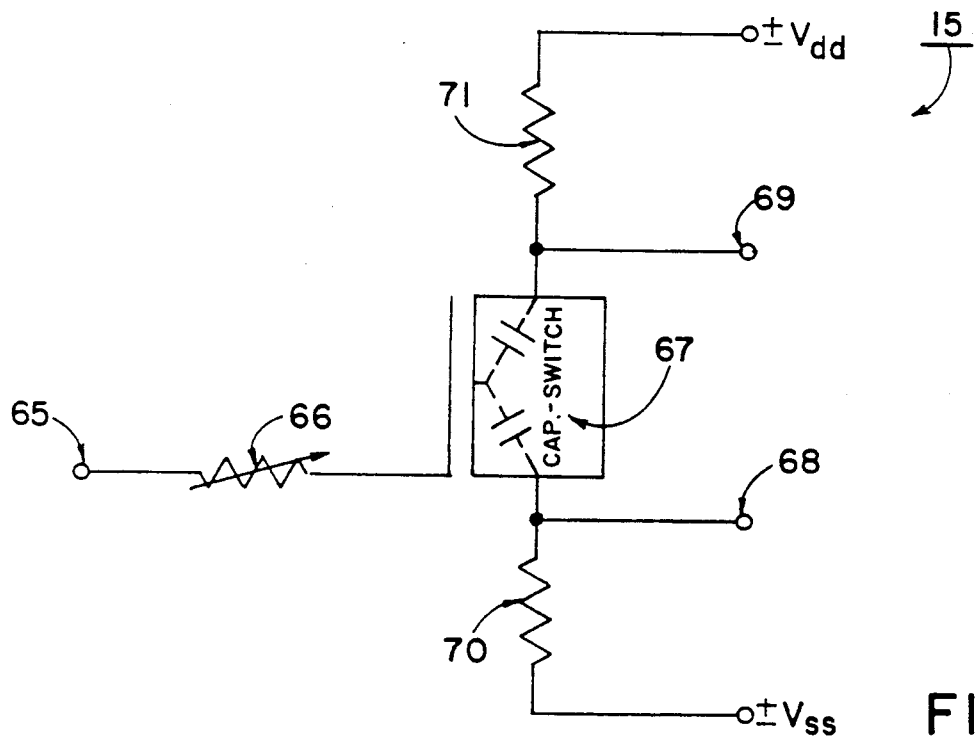

FIG. 6 depicts an embodiment in which the pulses applied will deactivate a normally active depletion mode MOSFET.

Figure 7:
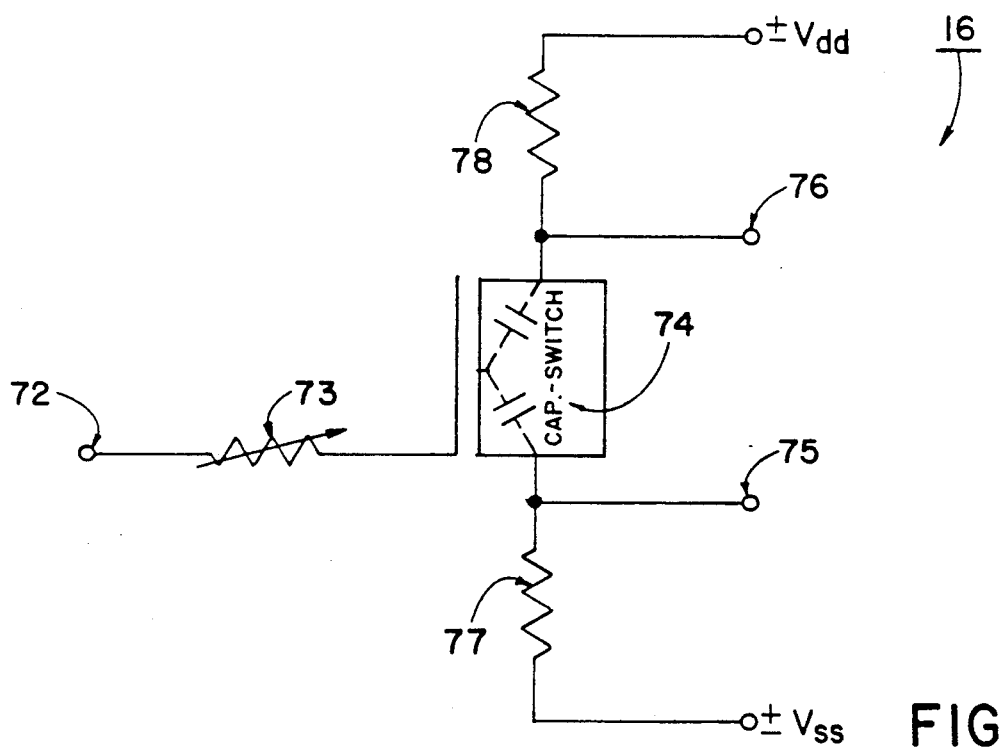

FIG. 7 demonstrates another embodiment of the invention having a junction field effect transistor (JFET) as the delay element and buffer and with a digital pulse applied. The normally active JFET will deactivate.

Figure 8:
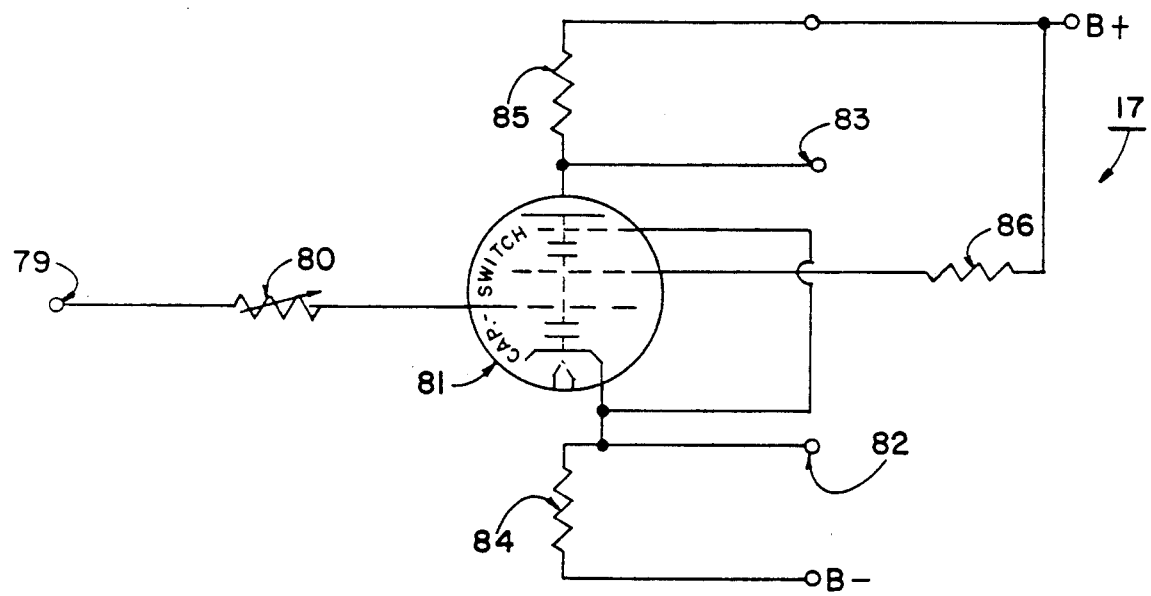

FIG. 8 shows an embodiment of the invention which uses a normally active diode-grid controlled vacuum tube as the delay element and buffer.

Figure 9:
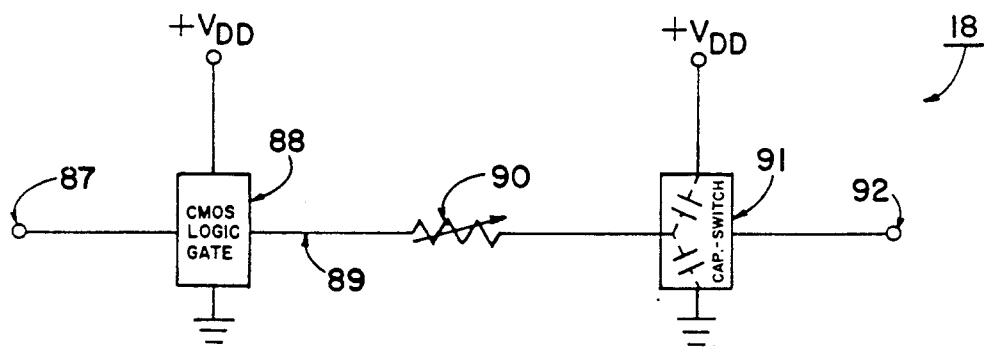

FIG. 9 provides a delay device which accurately delays and accurately reproduces TTL and CMOS logic signals.

DESCRIPTION OF THE PREFERRED EMBODIMENT

In the preferred embodiment of the device and its method of operation, the AC electrical signal delayed is in the form of a pulse or digital format. The preferred device as seen in FIG. 4 utilizes a differential logic gate which will accurately reproduce an input signal.

The preferred method of delaying electrical signals comprises inputting the signal to be delayed to an AC signal control means such as a resistor in FIG. 4, directing the controlled signal to an external capacitating means and an internal capacitor-switch to charge the internal capacitor-switch, thereafter changing the bias of said capacitor-switch to terminate the time delay.

DETAILED DESCRIPTION OF THE DRAWINGS AND OPERATION OF THE INVENTION

Figure 1:
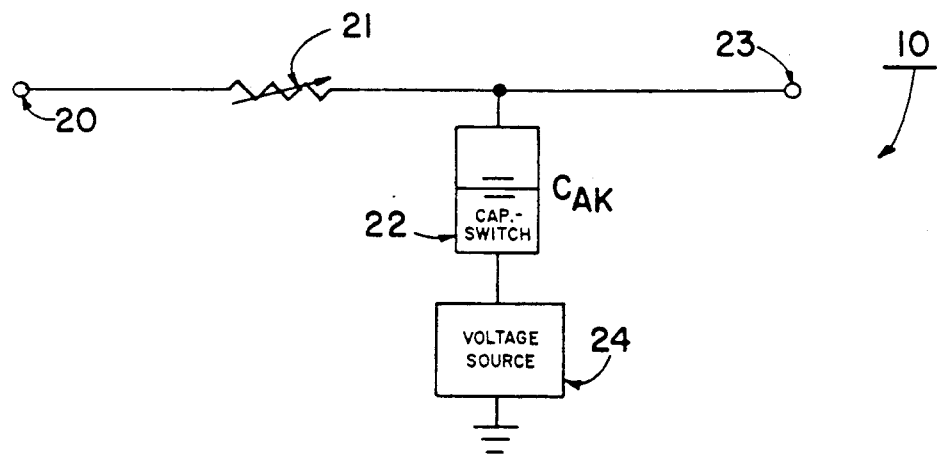
FIG. 1 demonstrates an embodiment of the invention utilizing a diode controlled device.

Turning now to the drawings, as seen in FIG. 1, a pulse is input to delay device 10 at input circuitry 20 and to AC external control means 21 which may be an inductor, a voltage variable resistor, a potentiometer rated from 0 to 500 K ohms, a current resistor or resistor network of any make or type having a maximum value of 500 K ohms, or a constant current source. Control means 21 retards or slows the charging of capacitor-switch 22, which in this embodiment may be the control inputs of a diode, a thyristor, a unijunction transistor, a programmable unijunction transistor or other device that uses a diode type junction as a controlling element. Capacitor-switch 22 operates in the inactive mode as an open switch-capacitor (Cak being the internal charging capacitance) and operates in the active mode as a closed switch-current control device. As the charging of capacitor-switch 22 reaches the bias activation voltage of capacitor-switch 22, which may be any of the selected active switching devices, capacitor-switch 22 closes and activates allowing the delayed signal to be seen at output circuitry 23. The amount of time delay between the input pulse at 20 and the output pulse at 23 is the delay of device 10. The voltage variable source 24 connected to capacitor-switch 22 is a biasing means for delay device 10 and may be a potentiometer or other voltage source.

Figure 2:
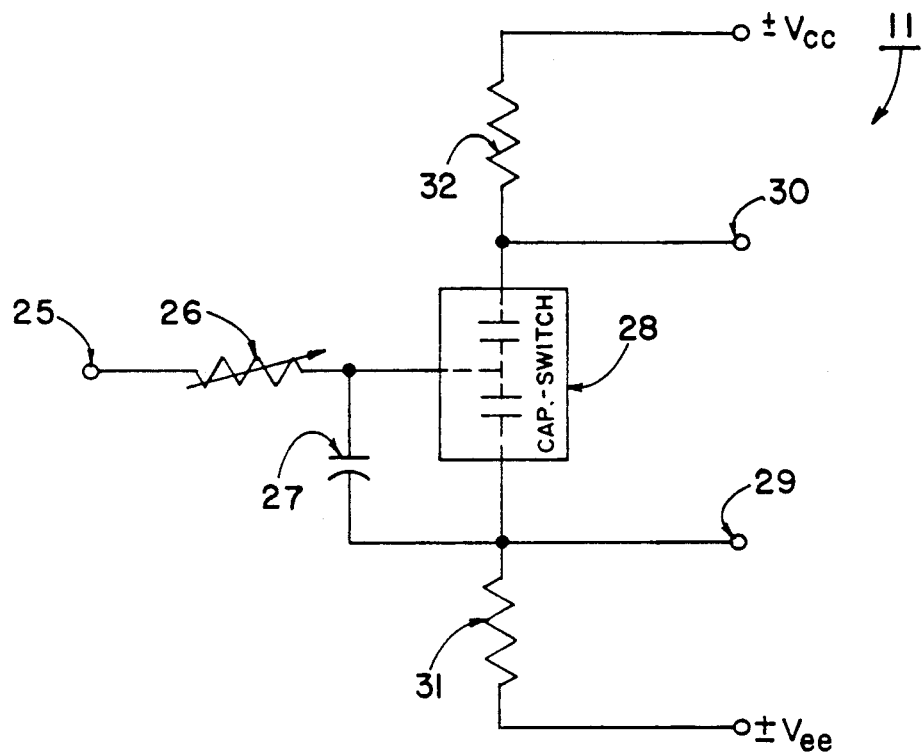
FIG. 2 is another embodiment of the invention utilizing a delay device for non-standard digital or pulse wave forms which require only single edge delay utilizing a NPN or PNP transistor.

In delay device 11 as seen in FIG. 2 a pulse is input at 25 to AC signal control means 26 which is a current resistor or resistor network of any make or type having a maximum value of 500 K ohms. AC signal control means 26 retards the charging rate of external capacitating means 27, which may be a capacitor having a value of 0 to 0.005 microforads (mf), and will slow the charging of capacitor-switch 28 which in this embodiment may be any type of bipolar NPN or PNP transistor. Capacitor-switch 28 operates in the inactive mode as an open switch-capacitor and operates in the active mode as a closed switch-current control device. As the charging of external capacitating means 27 and internal capacitor-switch 28 reaches the bias activation voltage of capacitor-switch 28, which may be a PNP or NPN transistor, capacitor-switch 28 closes and activates allowing the delayed signal to be seen at outputs 29 and 30. The amount of time delay between the input pulse at 25 and the output pulses at 29 and 30 is the delay of device 11. Resistor 31 and resistor 32 are biasing resistors necessary for the proper operation of the selected PNP or NPN transistor which acts as capacitor-switch 28 as well as the bias of the voltage sources (not shown).

In FIG. 3 which shows delay device 12, an ECL logic pulse is input at 33 to the non-inverting input of an optional buffer 34 which may be a Motorola MC10116, MC10H116, Fairchild F100114 or other type differential line receiver and to pulldown resistor 35 which is rated from 50 to 500 ohms. The inverting input of optional buffer 34 may be connected to an inverted signal source output or to a chip supplied Vbb. The ECL signal to be delayed is then output in differential form from optional buffer 34 which is terminated with pulldown resistors 37 and 38 each rated from 50 to 500 ohms to AC signal control means 39 and 40 which may be inductors, voltage variable resistors, potentiometers rated from 0 to 1000 ohms, current resistors or resistor networks of any make or type having a maximum value of 1000 ohms, or constant current sources. The purpose of AC signal control means 39 and 40 are to retard the charging rate of external capacitating means 41 and 42, which may be a capacitor of any make or type valued from 0 to 0.005 microfarads, and to slow the charging rate of the capacitor-switches 43 and 44 which each may be for example, Motorola MC10116, MC10H116, Fairchild F100114, or other type of differential line receiver. The respective capacitor-switches 43 and 44 operate in the inactive mode as open switch-capacitors and operate in the active mode as a closed switch-current control devices. As the charging of the external capacitating means 41 and 42 and internal capacitor-switches 43 and 44 reach the bias activation or deactivation voltage of the internal capacitor-switches 43 and 44, which may be a Motorola MC10116, MC10H116, Fairchild F100114 or other type of differential line receiver, capacitor-switches 43 and 44 activate or deactivate allowing the delayed signal to be seen at outputs 45 and 46 and at the differential line receiver outputs of capacitor-switches 43 and 44 with pulldown resistors 47 and 48 each rated from 50 to 500 ohms. The amount of time delay from ECL input 33 and 36 or pulldown resistors 37 and 38 to capacitor-switch outputs 45 and 46 is the delay of device 12. Biasing voltage sources are necessary for proper operation of device 12 but are not seen in FIG. 3.

Delay device 13 as depicted in FIG. 4 provides an ECL logic pulse input at 49 to the noninverting input of optional buffer 50, which may be a Motorola MC10116, MC10H116, Fairchild F100114, or other type of differential logic gate which acts to reproduce an input logic signal. Auxiliary inputs 95, 95' are shown connected to capacitor-switch 55. Input 95 is also joined to optional buffer 50, whereas input 95' is in contact with capacitor-switch 55. Pulldown resistor 51 is rated from 50 to 500 ohms. The inverting input of optional buffer 50 is connected to a chip supplied Vbb. The ECL signal to be delayed is output from optional buffer 50 which is terminated with pulldown resistor 52 (rated from 50 to 500 ohms) joined to AC signal control means 53 which may be an inductor, voltage variable resistor, a potentiometer of value from 0 to 1000 ohms, a current resistor or resistor network of any make or type having a maximum value of 1000 ohms, or a constant current source. AC signal control means 53 retards the charging rate of external capacitating means 54, which may be a capacitor or any make or type rated from to 0.005 microfarads, and to slow the charging rate of capacitor-switch 55 which may be a Motorola MC10116, MC10H116, Fairchild F100114, or other type of differential logic gate which acts to reproduce an input logic signal. Capacitor-switch 55 operates in the inactive mode as an open switch-capacitor and operates in the active mode as a closed switch-current control device. As the charging of external capacitating means 54 and the capacitor-switch 55 reach the bias activation or deactivation voltage of the internal capacitor-switch 55, which may be a Motorola MC10116, MC10H116, Fairchild 100114 or other type of differential logic gate which acts to reproduce an input logic signal, capacitor-switch 55 activates or deactivates, allowing the delayed signal to be seen at output 56 of the differential logic gate capacitor-switch 55 and pulldown resistor 57. The time delay from the ECL input 49 or pulldown resistor 52 and capacitor-switch output 56 is the delay of device 13. A biasing voltage source (not shown) is necessary for proper operation of delay device 13.

In FIG. 5 a pulse is input at 58 to delay device 14 and to AC signal control means 59 which may be a variable voltage resistor, a potentiometer, a current resistor or resistor network of any make or type having a maximum value of 500 K ohms, or a constant current source. AC signal control means 59 as explained in other embodiments is to retard or slow the charging rate of capacitor-switch 60, which in this embodiment may be any type of N or P Channel enhancement mode MOSFET transistor. Capacitor-switch 60 operates in the inactive mode as an open current switch-capacitor and operates in the active mode as a closed current switch-capacitor. As the charging of internal capacitor-switch 60 reaches the bias activation voltage Of the capacitor-switch 60, which may be any N or P channel enhancement mode MOSFET, capacitor-switch 60 closes and activates allowing the delayed signal to be seen at outputs 61 and 62 of capacitor-switch 60. The amount of time delay between the input pulse at 58 and the output pulses at 61 and 62 is the delay of the device. 63 and 64 are biasing resistors of any value necessary for proper operation of the selected N or P channel enhancement mode MOSFET capacitor-switch 60 as are the biasing voltage sources (not shown).

FIG. 6 shows delay device 15 whereby a pulse is input at 65 to AC signal control means 66 which is a variable voltage resistor. AC signal control means 66 retards the charging rate of the capacitor-switch 67, which in this embodiment may be any type of N or P channel depletion mode MOSFET transistor. Capacitor-switch 67 operates in the active mode as a closed current switch-capacitor and operates in the inactive mode as an open current switch-capacitor. As the charging of internal capacitor-switch 67 reaches the bias deactivation voltage of the capacitor-switch 67, which may be any N or P channel depletion mode MOSFET, the capacitor-switch 67 opens and deactivates allowing the delayed signal to be seen at outputs 68 and 69 of capacitor-switch 67. The amount of time delay between the input pulse at 65 and the output pulses at 68 and 69 is the delay of device 15. 70 and 71 are biasing resistors of value necessary for proper operation of the selected N or P channel depletion mode MOSFET, which acts as capacitor-switch 67 as are the biasing voltage sources (not seen).

In FIG. 7 delay device 16 operates with a pulse input at 72 to AC signal control means 73 which may be an inductor, a variable voltage resistor, a potentiometer rated from 0 to 500 K ohms a current resistor or resistor network of any make or type having a maximum value of 50 K ohms or a constant current source. The purpose of AC signal control means 73 is to retard or slow the charging rate of capacitor-switch 74, which in this embodiment may be any type of N or p channel Junction Field Effect Transistor (JFET). Capacitor-switch 74 operates in the active mode as a closed current switch-capacitor and operates in the inactive mode as an open current switch-capacitor. As the charging of internal capacitor-switch 74 reaches the bias deactivation voltage of capacitor-switch 74 which may be N or P channel Junction Field Effect Transistor, capacitor-switch 74 opens and deactivates allowing the delayed signal to be seen at either output 75 or 76 of capacitor-switch 74. The amount of time delay between the input pulse at 72 and the output pulses at 75 and 76 is the delay of device 16. 77 and 78 are biasing resistors of value necessary for proper operation of te selected N or P channel Junction Field Effect Transistor (JFET) which acts as capacitor-switch 74 as well as the biasing voltage sources (not seen).

A pulse is input at 79 in FIG. 8 delay device 17 to AC signal control means 80 which is a variable voltage resistor. AC signal control means 80 retards the charging rate of capacitor-switch 81, which in this embodiment is a typical grid controlled vacuum tube. Capacitor-switch 81 operates in the inactive mode as an open current switch-capacitor and operates in the active mode as a closed current switch-capacitor. As the charging of the internal capacitor-switch 81 reaches the bias deactivation voltage of capacitor-switch 81, which may be any suggested grid controlled vacuum tube, capacitor-switch 81 opens and deactivates, allowing the delayed signal to be seen at outputs 82 and 83 of capacitor-switch 81. The amount of time delay between the input pulse at 79 and the output pulses at 82 and 83 is the delay of device 17. 84, 85 and 86 are biasing resistors of value necessary for proper operation of the selected grid controlled vacuum tube which acts as capacitor-switch 81 as well as the biasing voltage sources (not shown in FIG. 8).

In FIG. 9 a TTL or CMOS logic pulse is input at 87 to optional buffer 88 which may be any CMOS logic gate which acts to reproduce an input logic signal. The TTL or CMOS signal to be delayed is then output from the optional buffer at 89 to an AC signal control means 90 which may be an inductor, a voltage variable resistor, a potentiometer, a current resistor or resistor network of any make or type having a maximum value rated from 0 to 500 K ohms, or a constant current source. AC signal control means 90 retards the charging rate of the capacitor-switch 91, which may be any CMOS logic gate which acts to reproduce an input logic signal. Capacitor-switch 91 operates in the inactive mode as an open switch-capacitor and operates in the active mode as a closed switch-current control device As the charging of internal capacitor-switch 91 reaches the activation or deactivation voltages of the capacitor-switch 91, which may be any CMOS logic gate which acts to reproduce an input TTL or CMOS logic signal, capacitor-switch 91 activates or deactivates allowing the delayed signal to be seen at output 92 of the CMOS logic gate capacitor-switch 91. The amount of time delay between the input pulse at 87 or 89 and output 92 of the CMOS logic gate capacitor-switch 91, is the delay of delay device 18. As earlier stated a biasing voltage source is necessary for delay device 18 to properly operate.

The illustrations and examples presented herein are for explanatory purposes and are not intended to limit the scope of the appended claims.

I claim:

1. An adjustable signal delay device for use in electrical circuits comprising: a variable AC signal control means, external capacitating means, a power source, a dual state diode junction controlled capacitor-switch, said power source joined to said capacitor-switch, said AC signal control means electrically connected to said external capacitating means, said AC signal control means directly connected to said capacitor-switch, input circuitry, said input circuitry joined to said AC signal control means, an electrical output, said output joined to said capacitor-switch whereby a signal entering said input circuitry is exactly reproduced with the output pulse width identical to the input pulse width and adjustably delayed prior to exiting said output.

2. A signal delay device as claimed in claim 1 wherein said signal control means comprises a current resistor.

3. A signal delay device as claimed in claim 1 and including auxiliary inputs, said inputs connected to said capacitor-switch, said auxiliary inputs for bias fixing of said capacitor-switch.

4. A signal delay device as claimed in claim 1 wherein said signal control means comprises an inductor.

5. A signal delay device as claimed in claim 1 wherein said signal control means comprises a voltage variable resistor.

6. A signal delay device as claimed in claim 1 wherein said signal control means comprises a constant current source.

7. A signal delay device as claimed in claim 1 wherein said signal control means comprises a potentiometer having a rating of from 0 to 1000 ohms.

8. A signal delay device as claimed in claim 1 wherein said external capacitating means is rated from 0 to 0.055 microfarads.

9. A signal delay device as claimed in claim 1 wherein said capacitor-switch comprises a differential line receiver.

10. A signal delay device as claimed in claim 1 wherein said capacitor-switch comprises a switching device/current control means.

11. A signal delay device as claimed in claim 1 wherein said capacitor-switch comprises a differential logic gate.

12. The method of delaying and reproducing an electrical signal with the output pulse width identical to the input pulse width comprising the steps of:
  a. inputting the signal to be delayed to a variable AC signal control means,
  b. directing the controlled signal to an external capacitating means and then to an internal diode junction controlled capacitor-switch to thereby delay the electrical signal,
  c. changing the bias of said capacitor-switch to terminate the time delay, and
  d. outputting a delayed signal which is an exact reproduction of the input signal with the output pulse width the same as the input pulse width.

13. The method of claim 12 wherein the step of directing the signal to an internal diode junction controlled capacitor-switch comprises the step of directing the signal to a capacitor-switch having auxiliary inputs for fixing the bias of said capacitor-switch.

14. The method of claim 12 whereby directing the controlled signal comprises the step of charging the capacitor-switch to its bias activation voltage.

15. The method of claim 12 whereby changing the bias of said capacitor-switch comprises the steps of changing the bias from inactive to active.

16. The method of claim 12 wherein inputting a signal comprises the step of inputting an ECL logic signal.

17. The method of claim 12 wherein inputting a signal comprises the step of inputting a voltage signal ranging from the minus supply rail to the positive supply rail.

18. The method of claim 12 wherein charging an internal capacitor-switch comprises input charging an ECL logic gate.

19. The method of claim 12 wherein inputting the signal to be delayed comprises inputting a signal of from 0 to 450 MPPS.

20. An adjustable signal delay device for use in electrical circuits comprising: a variable AC signal control means, said signal control means comprising a variable current resistor, external capacitating means, said capacitating means comprising a capacitor, a power source, a dual state diode junction controlled capacitor-switch, auxiliary inputs for fixing the bias of said capacitor-switch, said capacitor-switch comprising a differential amplifier, said power source joined to said differential amplifier, said current resistor connected to said capacitor, said current resistor directly connected to said differential amplifier, input circuitry, said input circuitry joined to said resistor, an electrical output, said output joined to said differential amplifier whereby a signal entering said input circuitry is exactly reproduced with the output pulse width identical to the input pulse width and adjustably delayed prior to exiting said output.

* * * * *